United States Patent

Feigl et al.

(10) Patent No.: US 7,986,455 B2
(45) Date of Patent: Jul. 26, 2011

(54) THERMALLY STABLE MULTILAYER MIRROR FOR THE EUV SPECTRAL RANGE

(75) Inventors: Torsten Feigl, Jena (DE); Nicolas Benoit, Giessen (DE); Sergiy Yulin, Jena (DE); Nobert Kaiser, Jena (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 12/188,603

(22) Filed: Aug. 8, 2008

(65) Prior Publication Data

US 2009/0009858 A1 Jan. 8, 2009

Related U.S. Application Data

(63) Continuation of application No. PCT/DE2007/000126, filed on Jan. 24, 2007.

(30) Foreign Application Priority Data

Feb. 10, 2006 (DE) .................. 10 2006 006 283

(51) Int. Cl.
 *F21V 9/04* (2006.01)
 *G02B 1/10* (2006.01)
(52) U.S. Cl. .................. 359/359; 359/586; 359/589
(58) Field of Classification Search .......... 359/350–361, 359/577–590
See application file for complete search history.

(56) References Cited

U.S. PATENT DOCUMENTS

| 5,190,807 | A |   | 3/1993  | Kimock et al. |
|-----------|---|---|---------|---------------|
| 5,480,706 | A | * | 1/1996  | Li et al. .......................... 428/113 |
| 5,887,048 | A | * | 3/1999  | Sata et al. ........................ 378/84 |
| 5,911,858 | A | * | 6/1999  | Ruffner .................... 204/192.27 |
| 6,073,559 | A | * | 6/2000  | Ellis .............................. 101/454 |
| 6,160,867 | A | * | 12/2000 | Murakami ....................... 378/84 |
| 6,279,476 | B1| * | 8/2001  | Ellis .............................. 101/454 |
| 6,396,900 | B1|   | 5/2002  | Barbee, Jr. et al. |
| 6,670,040 | B1| * | 12/2003 | Matsushita et al. ........... 428/408 |
| 7,012,753 | B2|   | 3/2006  | Quesnel |
| 2007/0170378 | A1 |   | 7/2007 | Bowering et al. |
| 2008/0043321 | A1 | * | 2/2008 | Bowering et al. ............. 359/359 |
| 2008/0088916 | A1 |   | 4/2008 | Benoit et al. |

FOREIGN PATENT DOCUMENTS

| DE | 100 11 547 A1   |   | 9/2001  |         |
|----|-----------------|---|---------|---------|
| DE | 100 11 548 A1   |   | 9/2001  |         |
| DE | 10 2004 062 289 A1 | | 7/2006 |         |
| EP | 1 348 984 A1    |   | 10/2003 |         |
| EP | 1 464 993 B1    |   | 10/2004 |         |
| WO | 2004/007796     | * | 1/2004  | ............. 359/350 |
| WO | WO 2005/091887 A2 | | 10/2005 |       |
| WO | WO 2006/066563 A1 | | 6/2006  |       |

* cited by examiner

*Primary Examiner* — Thong Nguyen
(74) *Attorney, Agent, or Firm* — Slater & Matsil, L.L.P.

(57) ABSTRACT

A multilayer mirror includes a layer sequence arranged on a substrate and a plurality of layer pairs. Each layer pair includes a first layer composed of a first material and a second layer composed of a second material. The first layers and the second layers each have a thickness of more than 2 nm, and the first material or the second material is a silicon boride or a molybdenum nitride.

20 Claims, 2 Drawing Sheets

THERMALLY STABLE MULTILAYER MIRROR FOR THE EUV SPECTRAL RANGE

This application is a continuation of co-pending International Application No. PCT/DE2007/000126, filed Jan. 24, 2007, which designated the United States and was not published in English, and which claims priority to German Application No. 10 2006 006 283.3 filed Feb. 10, 2006, both of which applications are incorporated herein by reference.

TECHNICAL FIELD

The invention relates to a thermally stable multilayer mirror for the extreme ultraviolet spectral range (EUV) and the use of the mirror.

BACKGROUND

Reflective optical components for use in the extreme ultraviolet spectral range (EUV), which encompasses the wavelength range from approximately 10 nm to approximately 50 nm, can be realized with multilayer mirrors containing a generally periodic layer sequence comprising a plurality of layer pairs. A layer pair generally contains two layers composed of different materials, which should have a maximum difference in their optical constants in the wavelength range provided for the use of the component. At least one of the materials, the so-called spacer material, should have a minimum absorption at the wavelength provided. The selection of the materials for the multilayer mirrors is therefore dependent primarily on the wavelength at which the optical component is intended to be used. In the EUV spectral range, therefore, for in each case a specific wavelength range that is usually only a few nanometers wide, there is an optimum material pairing that guarantees a high reflection on account of the optical contrast of the layer materials.

In the wavelength range from approximately 12.5 nm to 14 nm, which is of great importance, in particular, for the development of optical systems for applications in EUV lithography, multilayer mirrors comprising the material pairing molybdenum and silicon are preferably used since there is particularly good optical contrast between these materials in the wavelength range stated. With Mo/Si (molybdenum-silicon) multilayer mirrors it is possible to obtain, for example, a reflection of approximately 70% at a wavelength of 13.5 nm.

For the operation of optical systems for EUV lithography, laser plasma sources that emit at a wavelength of approximately 13.5 nm are provided, in particular, as radiation sources. Since the reflection of the overall optical system in EUV lithography is comparatively low due to the plurality of mirrors, EUV radiation sources of this type have to be operated with high powers in order to compensate for the reflection losses that arise in the optical system. In the vicinity of such a high-power EUV radiation source, EUV multilayer mirrors can be exposed to high temperatures. This is the case, in particular, for an EUV multilayer mirror which is positioned close to an EUV radiation source for beam shaping purposes, for example, as a so-called collector mirror.

At high temperatures the materials molybdenum and silicon tend, however, toward the formation of molybdenum silicide, in particular $MoSi_2$, and toward interdiffusion processes at the interfaces, as is known, for example, from German Patent Publication DE 100 11 547 C2. Therefore, at high application temperatures, there is the risk of degradation of such multilayer mirrors, which significantly reduces the reflection. In addition to reduction of the reflection, the degradation caused by interdiffusion processes and molybdenum silicide formation is also associated with a decrease in the thickness of the layer pairs, which is also referred to as period thickness. This decrease in the period thickness results in a shift in the reflection maximum toward a shorter wavelength. The function of an optical system based on Mo/Si multilayer mirrors can be considerably impaired or even completely destroyed by such degradation processes.

In order to increase the thermal stability of Mo/Si multilayer mirrors, it is known from German Patent Publication DE 100 11 547 C2 to insert a respective barrier layer of $Mo_2C$ at the interfaces between the molybdenum layers and the silicon layers. Furthermore, DE 100 11 548 C2 describes the use of barrier layers of $MoSi_2$ for increasing the thermal stability.

Furthermore, it is known from U.S. Pat. No. 6,396,900 to insert barrier layers composed of the material $B_4C$ into Mo/Si multilayer mirrors in order to increase the reflection and/or the thermal stability.

The use of such known barrier layers makes it possible to produce layer systems having a high reflection which have an improved thermal stability by comparison with pure Mo/Si layer systems.

In the case of Mo/Si layer systems with barrier layers, however, the technological requirements when producing the barrier layers are comparatively high since the thickness of the barrier layers is generally less than 0.5 nm. In particular, it is difficult to deposit a layer sequence with such thin barrier layers on curved substrates.

This holds true particularly if the angle of incidence of the EUV radiation varies over the surface of the multilayer mirror and, for this reason, the layer sequence has to have a layer thickness gradient in order to meet the Bragg reflection condition at all locations of the mirror surface.

SUMMARY OF THE INVENTION

In one aspect, the invention specifies a multilayer mirror for the EUV spectral range that is distinguished by a high thermal stability, in particular a comparatively high long-term stability, wherein the production outlay is preferably intended to be comparatively low.

BRIEF DESCRIPTION OF THE DRAWINGS

The invention is explained in more detail below on the basis of exemplary embodiments in connection with FIGS. 1 to 3, in which.

DETAILED DESCRIPTION OF ILLUSTRATIVE EMBODIMENTS

Figure 1:
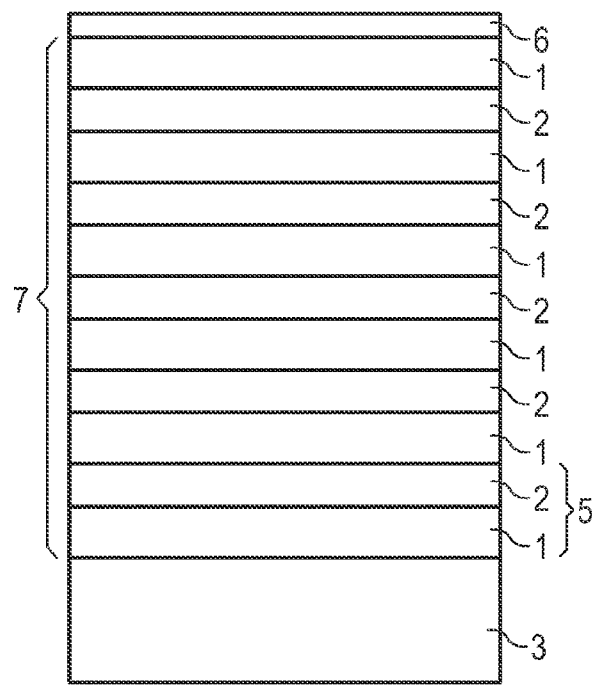
FIG. 1 shows a schematic illustration of a cross section through an exemplary embodiment of a multilayer mirror.

A multilayer mirror for EUV radiation according to embodiments of the invention contains a layer sequence arranged on a substrate and includes a plurality of layer pairs each comprising a first layer composed of a first material and, applied thereon, a second layer composed of a second material. The first layers and the second layers each have a thickness of more than about 2 nm, and the first material or the second material is a silicon boride or a molybdenum nitride.

By virtue of the fact that at least in each case one layer of the layer pairs is a silicon boride layer or a molybdenum nitride layer, the interdiffusion at the interfaces between the first layers and the second layers of the layer pairs is reduced, in particular, at high operating temperatures. The long-term thermal stability and the radiation stability of the multilayer mirrors are thereby advantageously improved by comparison with conventional multilayer mirrors.

In one preferred embodiment of the invention, the first material is a silicon boride and the second material is molybdenum. In the case of these multilayer mirrors, therefore, in comparison with a conventional Mo/Si multilayer mirror, the so-called spacer material silicon is replaced by a silicon boride.

In a further preferred embodiment of the invention, the first material is silicon and the second material is a molybdenum nitride. In comparison with a conventional Mo/Si multilayer mirror, therefore, the so-called absorber material molybdenum is replaced by a molybdenum nitride.

In the context of the application, the material designations silicon boride and molybdenum nitride encompass all compounds having the composition $Si_xB_y$ or $Mo_xN_y$, irrespective of the specific stoichiometric or non-stoichiometric composition of the respective material.

In contrast to EUV multilayer mirrors in which barrier layers having a thickness of typically less than about 0.5 nm are used for reducing the interdiffusion at the interfaces and, consequently, each period of the layer sequence includes a total of four layers, the production outlay is advantageously low in the case of a multilayer mirror according to embodiments of the invention, which has layer pairs comprising only two layers.

A further advantage with regard to the production outlay in comparison with multilayer mirrors having barrier layers arises from the fact that both the first and the second layers of the multilayer mirror according to an embodiment of the invention each have a thickness of more than about 2 nm.

This is advantageous, particularly when the multilayer mirror is provided for the reflection of radiation whose angle of incidence varies over the surface of the multilayer mirror. In this case, the first and/or the second layer of the layer pairs advantageously has a layer thickness gradient, that is to say that the thickness of the first and/or second layers varies in a lateral direction. The production of such layer thickness gradients is associated with a lower outlay in the case of a layer sequence in which the individual layers are at least about 2 nm thick than in the case of layer sequences having barrier layers in which at least the barrier layers have thicknesses in the sub-nanometer range.

The substrate is a planar substrate, for example. Furthermore, it is possible for the multilayer mirror to be applied to a curved surface of a substrate. For example, the surface of the substrate can have an aspherical curvature, for example, a parabolic or elliptic curvature. By way of example, a parabolically curved surface is suitable for generating a substantially parallel beam from a virtually punctiform radiation source, while an elliptically curved surface is suitable for focusing the beam from a radiation source arranged at a first focal point of the ellipse at a second focal point of the ellipse.

A multilayer mirror of this type is preferably used for the reflection of EUV radiation having a wavelength of between about 12.5 nm and about 14 nm.

The multilayer mirror can have, for example, a periodic arrangement of first and second layers, wherein the period thickness, that is to say the sum of the thicknesses of the first layer and of the second layer of the layer pairs, does not vary within the multilayer mirror. With a periodic multilayer mirror of this type it is possible to obtain a high reflection in a narrow spectral range around a predetermined wavelength. The period thickness of the layer sequence, that is to say the sum of the thicknesses of the first layer and of the second layer of the layer pairs, is in this case advantageously approximately 6.5 nm to 7.5 nm.

In the context of the invention, however, the multilayer mirror can also contain an aperiodic layer sequence within which the thicknesses of the first layers and/or of the second layers vary. With an aperiodic multilayer mirror of this type it is possible to obtain a high reflection of the multilayer mirrors in a comparatively wide wavelength range or angle of incidence range, although the maximum reflection at a predetermined wavelength is lower than in the case of a periodic multilayer mirror.

In the case of a preferred embodiment, a covering layer is applied to the multilayer mirror, which covering layer differs in terms of its material and/or its thickness from the layers of the layer pairs in order to protect the multilayer mirror, in particular, against oxidation and contamination. Instead of an individual covering layer, it is also possible for two or more covering layers to be applied. Particularly suitable materials for the covering layer are oxides, nitrides, carbides or borides, furthermore also ruthenium, rhodium, scandium and zirconium.

A multilayer mirror according to embodiments of the invention is particularly suitable for use at temperatures of more than 300° C., in particular in the temperature range from 300° C. to 500° C. The range indication, like all other range indications in the context of this application, includes the limits indicated.

A multilayer mirror according to the invention has the advantage, in particular, of a high long-term stability at temperatures of more than 300° C., in particular in the temperature range from 300° C. to 500° C. By way of example, a multilayer mirror according to embodiments of the invention still has no significant reduction of the reflection and/or period thickness even after an operating time of 100 hours at a temperature of approximately 500° C.

In a preferred configuration of the invention, the multilayer mirror is heated to a high operating temperature, for example, to 300° C. or more, preferably even to 400° C. or more, in order to reduce the deposition of contaminants on the multilayer mirror. For this purpose, a heating device can be provided, which is preferably fitted to a substrate of the multilayer mirror. This is advantageous, in particular, in the case of a multilayer mirror that is arranged in the vicinity of an EUV radiation source, since the multilayer mirror in this case could be contaminated by a target material used in the EUV radiation source, for example, lithium, the material being excited to emit EUV radiation by means of a laser beam, as a result of which contamination the reflection would be impaired. By heating the multilayer mirror to an operating temperature of preferably approximately 400° C., for example, the adhesion coefficient of lithium on a surface of the multilayer mirror is advantageously reduced in such a way that the reflection is not significantly impaired even after an operating time of 100 hours or more.

On account of its high thermal stability, a multilayer mirror according to an embodiment of the invention can be used, in particular, in the vicinity of an EUV radiation source, for example, a laser plasma source.

In the multilayer mirror according to an embodiment of the invention as illustrated in FIG. 1, a layer sequence 7 containing a number of layer pairs 5 is applied to a substrate 3. In order to simplify the illustration, only five layer pairs 5 are illustrated. A preferred number of layer pairs 5 is 30 to 100.

The layer pairs 5 in each case include of a first layer 1 composed of a first material and a second layer 2 composed of a second material. In this case, at least one of the materials is a silicon boride or a molybdenum nitride.

In one preferred embodiment of the invention, the first material is a silicon boride, for example, $SiB_4$ or $SiB_6$.

In a further preferred embodiment of the invention, the first material is silicon and the second material is a molybdenum nitride, for example, MoN.

The substrate 3 is, for example, a semiconductor substrate, in particular, composed of silicon or SiC, or a substrate composed of a glass or a glass ceramic, in particular, a glass ceramic having a low coefficient of thermal expansion. The substrate 3 advantageously has a surface roughness of less than about 0.2 nm. In this case, the surface roughness is understood to mean the rms roughness of the surface, which can be determined, for example, from curve fitting to X-ray reflection curves measured using Cu Kα radiation.

The multilayer mirror preferably has at least one covering layer 6 applied to the layer sequence 7. The thermal stability of the multilayer mirror 1 can be increased further by the choice of a material that is comparatively insensitive to oxidation for the covering layer 6.

Figure 2:
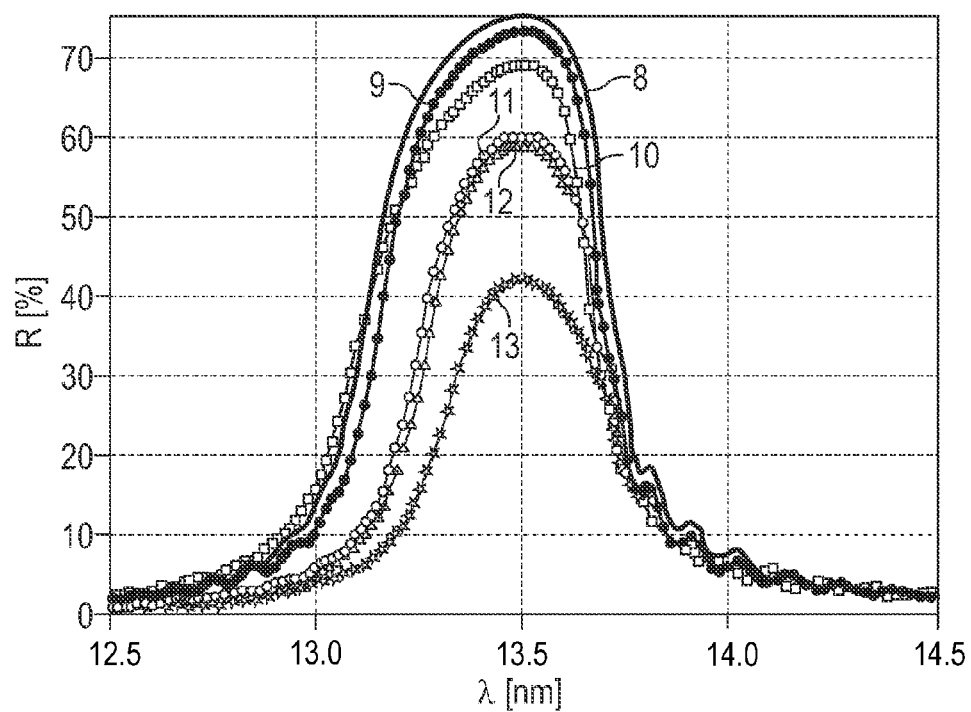
FIG. 2 shows a graphical illustration of the reflection R as a function of the wavelength λ of three exemplary embodiments of a multilayer mirror according to the invention in comparison with Mo/Si, $Mo/Si_3N_4$ and $Mo_2B$ multilayer mirrors.

FIG. 2 shows a graphical illustration of the calculated reflection R for perpendicular incidence as a function of the wavelength λ for a conventional Mo/Si multilayer mirror (curve 8), an $Mo_2B$/Si multilayer mirror (curve 9) and an $Mo/Si_3N_4$ multilayer mirror (curve 13) in comparison with three exemplary embodiments of a multilayer mirror according to the invention (curves 10, 11, 12). These exemplary embodiments involve an MoN/Si multilayer mirror (curve 10), an $Mo/SiB_4$ multilayer mirror (curve 11) and an $Mo/SiB_6$ multilayer mirror (curve 12). It was assumed for the calculated reflection curves that the number of layer pairs is in each case 100, and that a 2 nm thick covering layer composed of $SiO_2$ is applied to the layer sequence.

On account of the material selection made for obtaining an improved thermal stability, the multilayer mirrors according to an embodiment of the invention have a lower reflection than the material pairing Mo/Si used in conventional multilayer mirrors. As shown by the simulation calculations, with a multilayer mirror containing layer pairs composed of molybdenum and $SiB_4$ and $SiB_6$ it is possible to obtain a reflection of more than 55% (curves 11 and 12). For the material pairing MoN/Si, a reflection of more than 65% (curve 10) was calculated at the wavelength of approximately 13.5 nm that is often used for applications in EUV lithography.

The simulated reflectivities for the layer systems according to an embodiment of the invention thus lie between the calculated values for the material pairing $Mo/Si_3N_4$ (curve 13), which has a reflection of more than 40%, and for the material pairings $Mo_2B$/Si (curve 9) or Mo/Si (curve 8), for which a reflection of in each case more than 70% was calculated.

In actual layer systems, on account of the unavoidable interface roughnesses, the reflection can be at least slightly lower than in the case of the layer systems having ideally smooth interfaces that are taken as a basis for FIG. 2.

Figure 3:
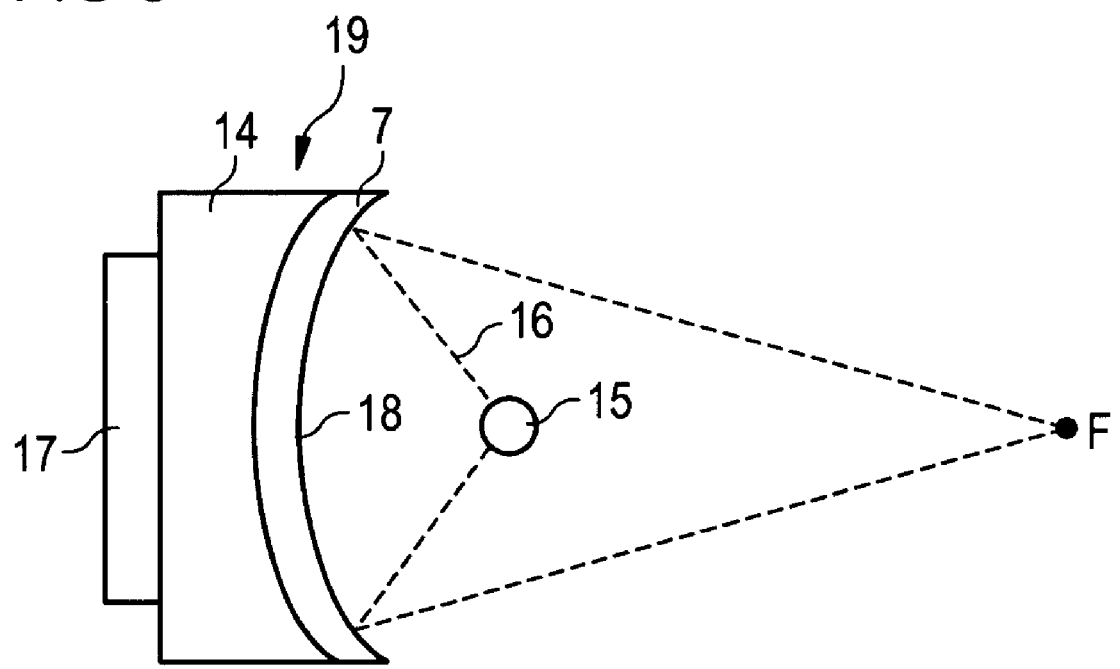
FIG. 3 shows a schematic graphical illustration of an arrangement in which an exemplary embodiment of a multilayer mirror according to the invention is used as a collector mirror of an EUV radiation source.

FIG. 3 schematically shows an exemplary embodiment of a multilayer mirror 19 according to an embodiment of the invention, this mirror having a layer sequence 7 applied to a curved, preferably aspherically curved, substrate 14. The layer sequence 7 contains layer pairs comprising first layers and second layers (not illustrated), wherein the first and/or the second layers preferably have a layer thickness gradient in a lateral direction. By way of example, the layer thickness of the first and/or of the second layers of the layer sequence 7 increases from the center of the multilayer mirror toward the edge regions in order to meet the Bragg reflection condition for the EUV radiation 16 from an EUV radiation source 15 that impinges on the multilayer mirror 19 at different angles of incidence.

The multilayer mirror 19 functions as a collector mirror of the EUV radiation source 15. The EUV radiation 16 emitted by the EUV radiation source 15 is focused at a focal point F, for example, by the collector mirror. The EUV radiation source 15 is a laser plasma radiation source, for example, in which a target material, for example, lithium droplets, are excited to emit EUV radiation by means of laser radiation. In EUV radiation sources of this type there is often the problem that optical elements arranged in the vicinity of the radiation source are contaminated by the target material.

In the case of the multilayer mirror 19, a heating device 17 is provided at the substrate 14 in order to solve this problem. The heating device heats the multilayer mirror to a temperature at which the target material of the EUV radiation source 15 has only a low adhesion coefficient and therefore desorbs from the surface 18 of the multilayer mirror 19. Preferably, the multilayer mirror 19 is heated to an operating temperature of approximately 400° C. or more by means of the heating device 17. A temperature of approximately 400° C. is advantageous particularly in the case of a lithium target.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A multilayer mirror for extreme ultraviolet (EUV) radiation, the multilayer mirror comprising:
   a substrate; and
   a layer sequence arranged on the substrate, the layer sequence comprising a plurality of layer pairs, each layer pair comprising a first layer composed of a first material and a second layer composed of a second material;
   wherein the layer sequence is reflective for extreme ultraviolet radiation;
   wherein the first layers and the second layers each have a thickness of more than 2 nm and wherein the sum of the thickness of the first layer and the thickness of the second layer is between 6.5 nm and 7.5 nm;
   wherein the first material or the second material comprises a silicon boride; and
   wherein the silicon boride is a compound.

2. The multilayer mirror as claimed in claim 1, wherein the first material is a silicon boride and the second material is molybdenum.

3. The multilayer mirror as claimed in claim 1, wherein the substrate has a curved surface.

4. The multilayer mirror as claimed in claim 3, wherein the surface of the substrate is curved aspherically.

5. The multilayer mirror as claimed in claim 1, further comprising a covering layer overlying the layer sequence.

6. The multilayer mirror as claimed in claim 5, wherein the covering layer comprises an oxide, silicide, nitride, carbide or boride.

7. The multilayer mirror as claimed in claim 5, wherein the covering layer comprises at least one of ruthenium, rhodium, scandium and/or zirconium.

8. The multilayer mirror as claimed in claim 1, further comprising a heating device that is provided in order to heat the multilayer mirror at an operating temperature of 300° C. or more.

9. The multilayer mirror as claimed in claim 8, wherein the heating device is provided in order to heat the multilayer mirror at an operating temperature of 400° C. or more.

10. The multilayer mirror as claimed in claim 8, wherein the heating device is fitted to the substrate.

11. The multilayer mirror as claimed in claim 1, wherein the multilayer mirror is a collector mirror of an EUV radiation source.

12. The use of a multilayer mirror as claimed in claim 1 for the reflection of EUV radiation at an operating temperature of 300° C. to 500° C.

13. The multilayer mirror as claimed in claim 1, wherein the silicon boride is $SiB_4$.

14. The multilayer mirror as claimed in claim 1, wherein the silicon boride is $SiB_6$.

15. The multilayer mirror as claimed in claim 1, wherein the silicon boride is a stoichiometric compound.

16. A radiation arrangement comprising:
a radiation source that emits radiation in an extreme ultraviolet (EUV) range; and
a collector mirror adjacent the radiation source, the collector mirror comprising a substrate and a layer sequence arranged on the substrate, the layer sequence comprising a plurality of layer pairs, each layer pair comprising a first layer composed of a first material and a second layer composed of a second material, wherein the first layers and the second layers each have a thickness of more than 2 nm, wherein the sum of the thickness of the first layer and the thickness of the second layer is between 6.5 nm and 7.5 nm and wherein the first material or the second material comprises a silicon boride compound.

17. The arrangement as claimed in claim 16, further comprising a heating device attached to the substrate.

18. The arrangement as claimed in claim 16, wherein the first material is a silicon boride compound and the second material is molybdenum.

19. The arrangement as claimed in claim 16, wherein the substrate has an aspherically curved surface.

20. The arrangement as claimed in claim 16, wherein the first material or the second material comprises a stoichiometric silicon boride compound.

* * * * *

UNITED STATES PATENT AND TRADEMARK OFFICE
CERTIFICATE OF CORRECTION

PATENT NO.       : 7,986,455 B2
APPLICATION NO.  : 12/188603
DATED            : July 26, 2011
INVENTOR(S)      : Feigl et al.

It is certified that error appears in the above-identified patent and that said Letters Patent is hereby corrected as shown below:

In Col. 6, line 36, claim 1, delete "minor" and insert --mirror--.
In Col. 7, line 3, claim 8, delete "minor" and insert --mirror--.
In Col. 7, line 7, claim 9, delete "minor" and insert --mirror--.
In Col. 7, line 11, claim 11, delete "multilayer minor" and insert --multilayer mirror--.
In Col. 7, line 11, claim 11, delete "collector minor" and insert --collector mirror--.
In Col. 7, line 13, claim 12, delete "minor" and insert --mirror--.
In Col. 7, line 18, claim 14, delete "minor" and insert --mirror--.
In Col. 8, line 2, claim 16, delete "minor" and insert --mirror--.

Signed and Sealed this
Eighteenth Day of October, 2011

David J. Kappos
*Director of the United States Patent and Trademark Office*